United States Patent
Agan et al.

(10) Patent No.: US 7,206,221 B2
(45) Date of Patent: Apr. 17, 2007

(54) UPSIDE-DOWN MAGNETORESISTIVE RANDOM ACCESS MEMORY

(75) Inventors: Tom Allen Agan, Saint Paul, MN (US); James Chyi Lai, Saint Paul, MN (US); Chien-Chiang Chan, Chung-Ho (TW)

(73) Assignee: Northern Lights Semiconductor Corp., St. Paul, MN (US)

( * ) Notice: Subject to any disclaimer, the term of this patent is extended or adjusted under 35 U.S.C. 154(b) by 34 days.

(21) Appl. No.: 11/223,159

(22) Filed: Sep. 9, 2005

(65) Prior Publication Data

US 2007/0058423 A1  Mar. 15, 2007

(51) Int. Cl.
*G11C 11/00* (2006.01)
(52) U.S. Cl. .................. 365/158; 365/104; 365/189.08
(58) Field of Classification Search ................ 365/158, 365/104, 189.08, 230.07, 189.09, 230.06
See application file for complete search history.

(56) References Cited

U.S. PATENT DOCUMENTS

2004/0246761 A1* 12/2004 Nishihara et al. ........... 365/145
2006/0120146 A1* 6/2006 Ezaki et al. ................. 365/158

\* cited by examiner

*Primary Examiner*—Richard T. Elms
*Assistant Examiner*—Dang Nguyen
(74) *Attorney, Agent, or Firm*—Thomas, Kayden, Horstemeyer & Risley

(57) ABSTRACT

An upside-down MRAM comprises a sense transistor and a plurality of sense lines. A first end of the sense transistor is electrically connected to a low voltage. The sense lines are electrically connected in parallel between a high voltage and a second end of the sense transistor. Each of the sense lines has a control logic and at least one memory bit, and the memory bit is connected in series between the high voltage and the control logic.

17 Claims, 4 Drawing Sheets

UPSIDE-DOWN MAGNETORESISTIVE RANDOM ACCESS MEMORY

BACKGROUND

1. Field of Invention

The present invention relates to a magnetoresistive random access memory (MRAM). More particularly, the present invention relates to an upside-down memory structure of MRAM.

2. Description of Related Art

Magnetoresistive random access memory (MRAM) is a type of non-volatile memory with fast programming time and high density. An MRAM cell has two ferromagnetic layers separated by a non-magnetic layer. Information is stored as directions of magnetization vectors in the two ferromagnetic layers.

FIG. 1 is a schematic view of a conventional MRAM of a standard structural design. As illustrated in FIG. 1, an MRAM 100 has a plurality of MRAM cells 106 placed on intersections of "M" sense lines 102 and "N" word lines 104, thus forming an N×M matrix. The MRAM cells 106 of one sense line 102, which present memory bits of the MRAM 100, are electrically connected in series between a ground voltage (GND) and a transistor 112 for row selection. The transistor 112 is further electrically connected to a supply voltage ($V_{DD}$) in series through two transistors 114 and 116 for sense column selection and sense current source, respectively.

The MRAM cells 106 are accessed with sense currents which are generally controlled by current mirrors. However, in the conventional MRAM of the standard structural design, the current mirrors are unstable because they are relative to the high voltage ($V_{DD}$), which tends to have many variations. Moreover, the sense lines 102 are connected together with only one drawing current, and when one sense line becomes active, the other sense lines load the active sense line. That is, in order to obtain the signal from the active sense line 102, other sense lines connected together have to be charged to the value set by the active sense line. The RC time constant is thus increased, and the settling time for the active sense line requires additional time for both READ and WRITE cycles, worsening the performance of MRAM.

SUMMARY

It is therefore an aspect of the present invention to provide an upside-down magnetoresistive random access memory (MRAM), which has better control over currents and can improve the performance and reduce noise.

According to one preferred embodiment of the present invention, the upside-down MRAM comprises a sense transistor and a plurality of sense lines. A first end of the sense transistor is electrically connected to a low voltage. The sense lines are electrically connected in parallel between a high voltage and a second end of the sense transistor. Each of the sense lines has a control logic and at least one memory bit, and the memory bit is connected in series between the high voltage and the control logic.

According to another preferred embodiment of the present invention, the upside-down MRAM comprises a plurality of memory units electrically connected. Each of the memory units comprises at least one sense transistor, a plurality of word lines, a plurality of sense lines and a plurality of memory bits. The sense lines intersect the word lines. The memory bits are disposed on intersections of the sense lines and the word lines. A first end of each sense line is electrically connected to a high voltage, and a second end of each sense line is electrically connected to a low voltage through the sense transistor.

It is to be understood that both the foregoing general description and the following detailed description are examples and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
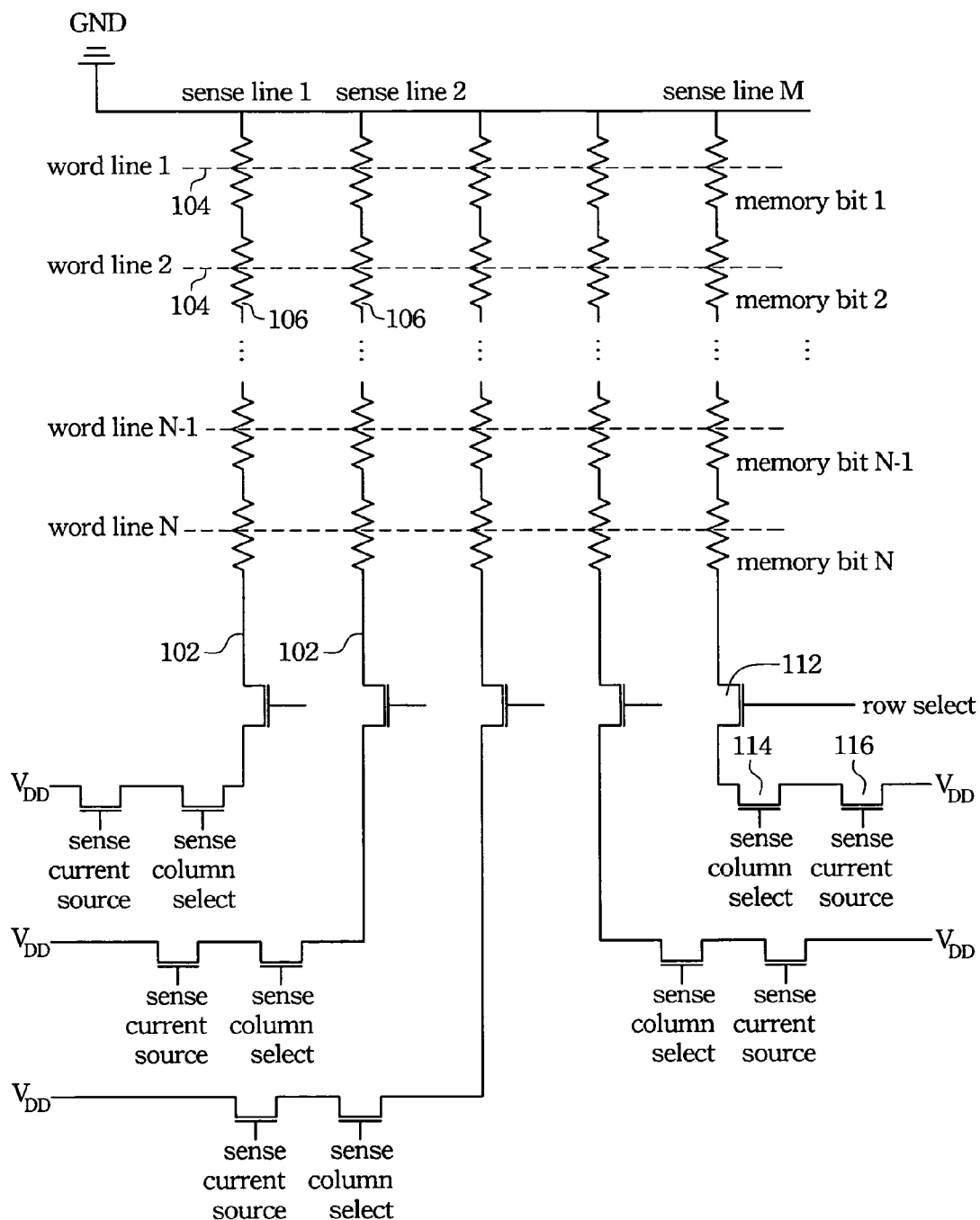
FIG. 1 is a schematic view of a conventional MRAM of a standard structural design.

Reference will now be made in detail to the present preferred embodiments of the invention, examples of which are illustrated in the accompanying drawings. Wherever possible, the same reference numbers are used in the drawings and the description to refer to the same or like parts.

The present invention swaps the relative connecting positions of the high voltage and the low voltage applied to the conventional MRAM of a standard structural design, reversing the current direction of the sense lines. Compared to the conventional MRAM, whose current flows from the sense transistor to the memory bits, the present invention flows its current from the memory bits to the sense transistor, named as an upside-down memory structure. The present invention thus can control the currents well, have good performance and less noise, and dissipate heat effectively.

Figure 2A:
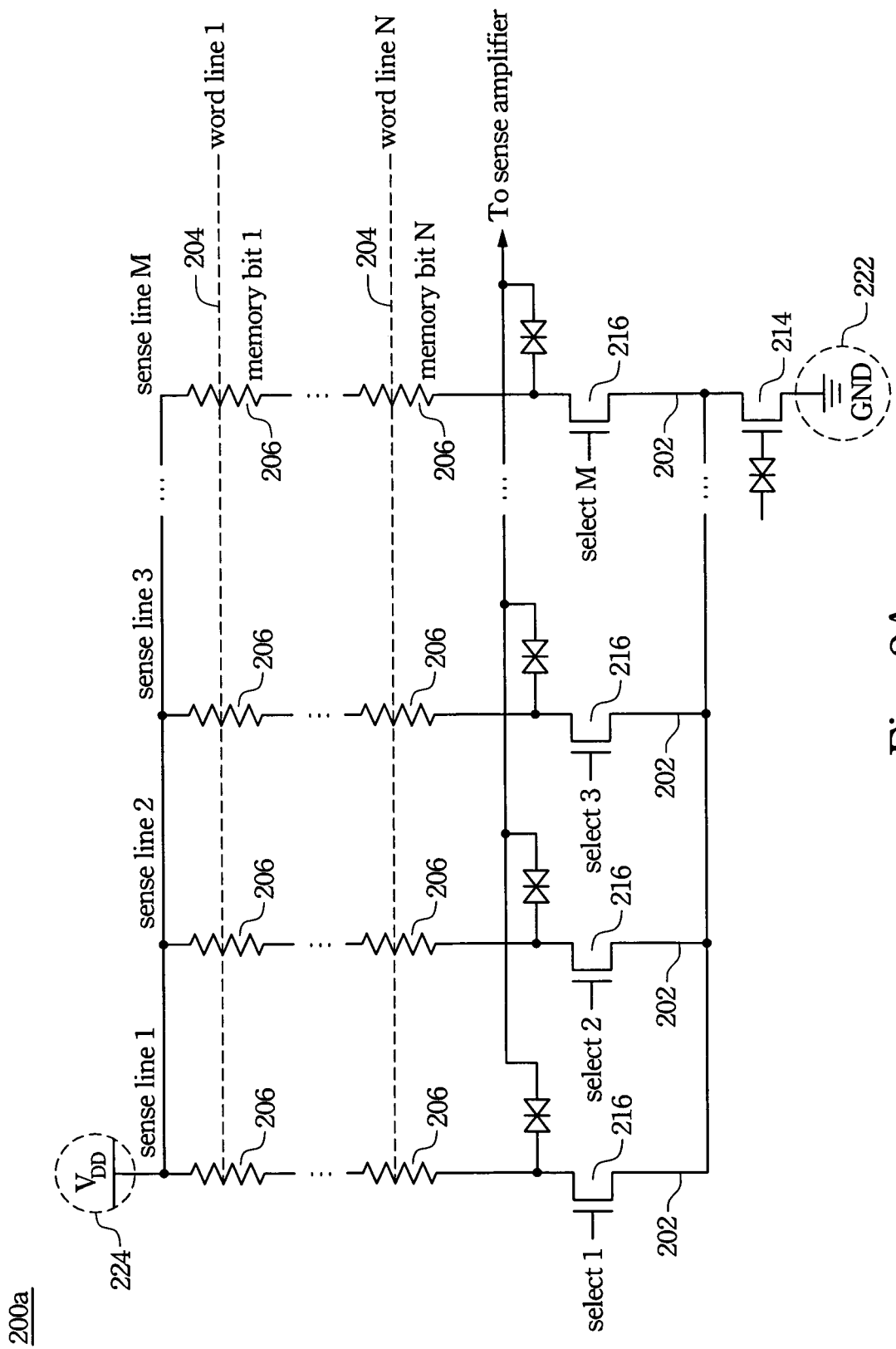
FIG. 2A is a schematic view of one preferred embodiment of the present invention.

FIG. 2A is a schematic view of one preferred embodiment of the present invention. An upside-down MRAM 200a comprises a plurality of sense lines 202 and a sense transistor 214, i.e. a so-called pull-down transistor. A first end of the sense transistor 214 is electrically connected to a low voltage 222. The sense lines 202 are electrically connected in parallel between a high voltage 224 and a second end of the sense transistor 214. Each of the sense lines 202 has a control logic 216 and at least one memory bit 206, and the memory bit 206 is connected in series between the high voltage 224 and the control logic 216.

In another aspect, the upside-down MRAM 200a comprises at least one sense transistor 214, a plurality of word lines 204, a plurality of sense lines 202 and a plurality of memory bits 206. The sense lines 202 intersect the word lines 204. The memory bits 206 are disposed on intersections of the sense lines 202 and the word lines 204. A first end of each sense line 202 is electrically connected to a high voltage 224, and a second end of each sense line 202 is electrically connected to a low voltage 222 through the sense transistor 214.

More particularly, the upside-down MRAM 200a has "M" sense lines 202 electrically connected in parallel, where "M" is more than one. Each of the sense lines 202 has "N" memory bits 206 electrically connected in series, where "N"

is at least one. The sense transistor 214 (i.e. the pull-down transistor) can access, such as by reading and writing, the "N" memory bit 206 of the selected sense line 202. The control logics 216 switch the "M" sense lines 202 to select one of the "M" sense lines 202 for the sense transistor 214 according to select signals. The control logic 216 of each sense line 202 is electrically connected between the sense transistor 214 and the memory bits 206. The control logics 216 can be transistors, diodes or other switching elements.

Moreover, the high voltage can be a supply voltage ($V_{DD}$) and the low voltage can be a ground voltage (GND), for example. That is, when one of the sense lines 202 is selected, the current of the selected sense line 202 flows from the memory bits 206 to the sense transistor 214. The memory bit 206 can be an MRAM cell, which has two ferromagnetic layers separated by a non-magnetic layer. In addition, the sense transistor 214 is preferably connected on the middle position of the sense lines 202, in order to optimize the signal transmission lengths of the two farthest sense lines 202.

Figure 2B:
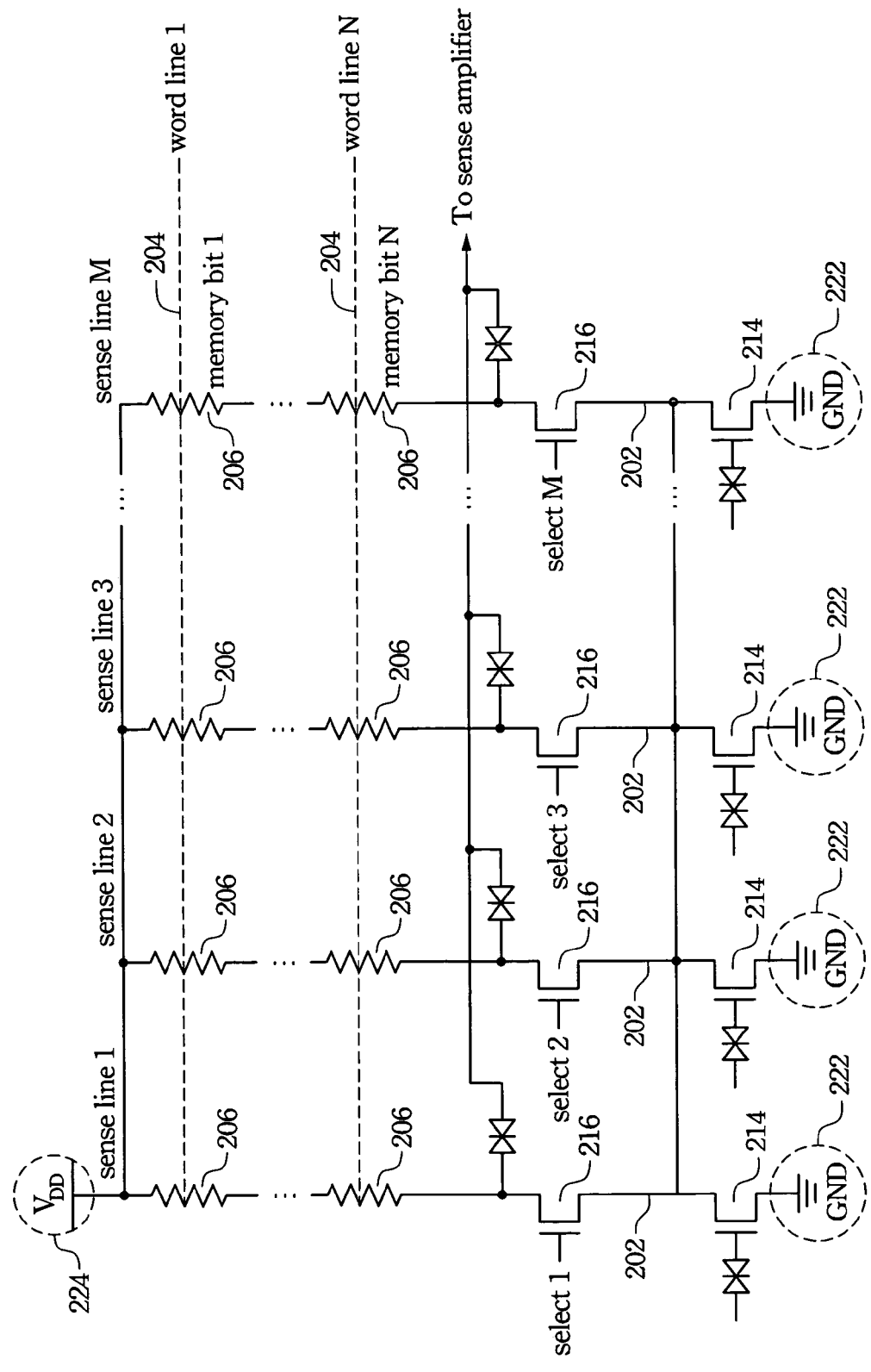
FIG. 2B is a schematic view of another preferred embodiment of the present invention.

FIG. 2B is a schematic view of another preferred embodiment of the present invention, illustrating an upside-down MRAM having a plurality of sense transistors. When an upside-down MRAM 200b comprises a plurality of sense transistors 214, one of the sense transistors 214 is electrically connected to one of the sense lines 202. In other words, every sense line 202 is accessed by its own sense transistor 214 in this preferred embodiment. Persons skilled in the art should understand that two or more sense lines 202 can be one set to be accessed by one sense transistor 214 under proper design and arrangement, not limited to the all-to-one or one-to-one configurations as illustrated in FIGS. 2A and 2B.

Figure 3:
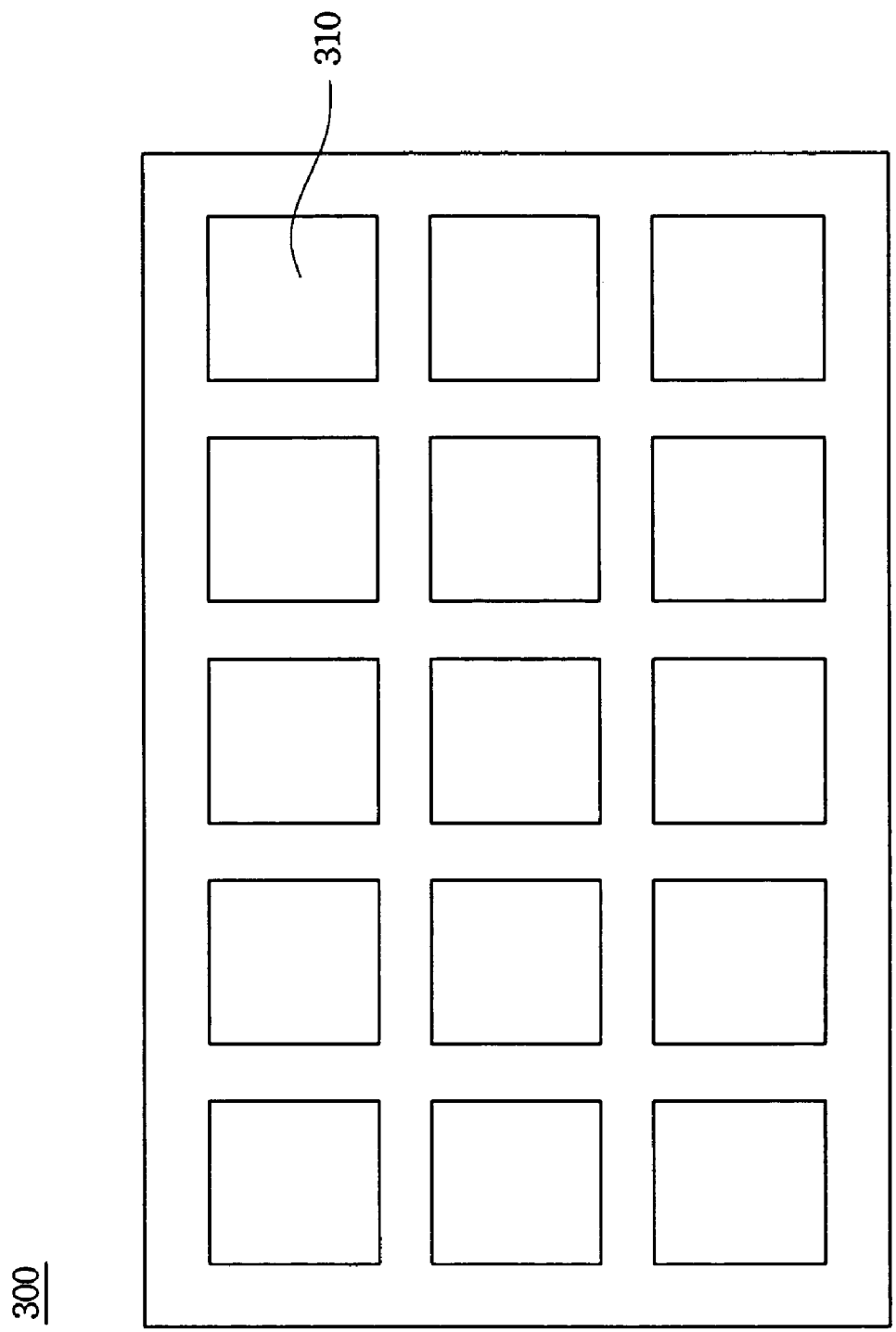
FIG. 3 is a schematic view of another preferred embodiment of the present invention.

FIG. 3 is a schematic view of another preferred embodiment of the present invention. An upside-down MRAM 300 comprises a plurality of memory units 310 electrically connected. The memory unit 310 is similar to the magnetoresistive memories 200a and 200b as illustrated in FIGS. 2A and 2B, which have a sense transistor 214 and a plurality of sense lines 202 as stated above. By this manner, when a greater memory capacity is required, the foregoing memory architecture of a smaller capacity can be a memory unit to be extended to a memory of a greater capacity.

By the upside-down memory structure, the preferred embodiments have many advantages, especially compared to the conventional memory structure design. First, the more stably the currents are maintained across all conditions, the better the access capabilities can be achieved. The current mirrors for controlling the sense currents in the preferred embodiments are relative to the low voltage (i.e. the ground voltage), which varies less than the high voltage (i.e. the supply voltage), thus obtaining a more stable current control. The current mirrors used in the conventional memory structure are unstable in that they are relative to the supply voltage ($V_{DD}$). If the sense currents are not controlled well, adjacent memory bits may be inadvertently written, or the memory bit in question may not be written, or the memory bits may even be overwritten during a READ cycle. Therefore, the preferred embodiments avoid these mistakes by making the current mirrors to be relative to the low voltage.

Second, in the conventional memory structure, the sense line is connected at both ends to the transistors. With the large currents, numerous vias (e.g. at least 6 vias) between each set of layers are needed on each end to make those connections. Additionally, all metal layers are connected to the transistors, from the top to the bottom on both sides. The upside-down memory structure requires only one side to be attached to transistors while the other side is attached at a strap metal layer for supplying power. This makes easier layout and results in a smaller design. Smaller size translates into more dies per wafer and lower manufacturing costs.

Third, the RC time constant is reduced by swapping the relative connecting positions of the high voltage and the low voltage, making only one sense line active without being loaded by other sense lines. The preferred embodiments thus reduce the large RC time constant (approximately 6 ns) of the conventional memory structure which originates from other sense lines loading the active sense line. The waiting time for the loading of other sense lines is removed and all READ/WRITE operations can be sped up.

Fourth, when the sense lines are connected directly to the supply voltage ($V_{DD}$), it is easier to distribute power across the whole memory. Better power supply distribution helps to reduce noise. Moreover, the sense amplifiers amplify the sensed signals well. It is critical to both amplify the signal and avoid noise adjacent to the sense amplifiers. The upside-down memory structure allows physically removing the sense line driver, an element causing most noise, away from the sense amplifiers.

Fifth, although an MRAM chip is not prone to overheating, localized heating is still possible, which reduces the memory reliability. Heat generated inside a chip is primarily dissipated by metal layers. In the conventional memory structure, the sense line is connected to the transistors at both ends, reducing the amount of metal for heat dissipation. The upside-down memory structure can provide a large metal bus (i.e. the $V_{DD}$ bus) connected to the sense lines, so as to create a huge heat sink to effectively eliminate the potential for overheating.

Sixth, three transistors connected in series with memory bits are used on a sense line to control the voltage in the conventional memory structure. The upside-down memory structure only requires two transistors, thus reducing the series resistance. It also provides more overhead voltage to prevent the current mirrors from saturation and losing the ability to control the current. In other words, more design margin is allowed and the potential for adding more memory bits into one sense line is raised. Alternatively, the additional design margin can be traded for smaller size of the sense transistors, resulting in a smaller die size.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An upside-down magnetoresistive random access memory (MRAM), comprising:
   a sense transistor, a first end of the sense transistor being electrically connected to a low voltage; and
   a plurality of sense lines electrically connected in parallel between a high voltage and a second end of the sense transistor, wherein each of the sense lines has a control logic and at least one memory bit, and the memory bit is connected in series between the high voltage and the control logic.

2. The upside-down MRAM as claimed in claim 1, wherein the high voltage is a supply voltage and the low voltage is a ground voltage.

3. The upside-down MRAM as claimed in claim 1, wherein the control logic is a transistor or a diode.

4. The upside-down MRAM as claimed in claim 1, further comprising at least one word line, electrically connected to the memory bits of the sense lines.

5. The upside-down MRAM as claimed in claim 1, wherein the memory bit is an MRAM cell.

6. An upside-down magnetoresistive random access memory (MRAM), comprising:
- at least one sense transistor;
- a plurality of word lines;
- a plurality of sense lines, intersecting the word lines; and
- a plurality of memory bits, disposed on intersections of the sense lines and the word lines, wherein a first end of each sense line is electrically connected to a high voltage, and a second end of each sense line is electrically connected to a low voltage through the sense transistor.

7. The upside-down MRAM as claimed in claim 6, wherein the high voltage is a supply voltage and the low voltage is a ground voltage.

8. The upside-down MRAM as claimed in claim 6, wherein when the upside-down MRAM comprises a plurality of sense transistors, one of the sense transistors is electrically connected to one of the sense lines.

9. The upside-down MRAM as claimed in claim 6, wherein each of the sense lines further comprises a control logic, electrically connected between the memory bits and the sense transistor.

10. The upside-down MRAM as claimed in claim 9, wherein the control logic is a transistor or a diode.

11. The upside-down MRAM as claimed in claim 6, wherein the memory bits are MRAM cells.

12. An upside-down magnetoresistive random access memory (MRAM), comprising:
- a plurality of memory units electrically connected, wherein each of the memory units comprises:
  - at least one sense transistor;
  - a plurality of word lines;
  - a plurality of sense lines, intersecting the word lines; and
  - a plurality of memory bits, disposed on intersections of the sense lines and the word lines, wherein a first end of each sense line is electrically connected to a high voltage, and a second end of each sense line is electrically connected to a low voltage through the sense transistor.

13. The upside-down MRAM as claimed in claim 12, wherein the high voltage is a supply voltage and the low voltage is a ground voltage.

14. The upside-down MRAM as claimed in claim 12, wherein when each of the memory units comprises a plurality of sense transistors, one of the sense transistors is electrically connected to one of the sense lines.

15. The upside-down MRAM as claimed in claim 12, wherein each of the sense lines further comprises a control logic, electrically connected between the memory bits and the sense transistor.

16. The upside-down MRAM as claimed in claim 15, wherein the control logic is a transistor or a diode.

17. The upside-down MRAM as claimed in claim 12, wherein the memory bits are MRAM cells.

* * * * *